United States Patent
Zou et al.

(10) Patent No.: US 9,634,269 B2
(45) Date of Patent: Apr. 25, 2017

(54) CONDUCTIVE FLEXIBLE SUBSTRATE AND MANUFACTURE THEREOF, AND OLED DISPLAY DEVICE AND MANUFACTURE METHOD THEREOF

(71) Applicant: Shenzhen China Star Optoelectronics Technology Co., Ltd., Shenzhen, Guangdong (CN)

(72) Inventors: Qinghua Zou, Guangdong (CN); Yifan Wang, Guangdong (CN); Taipi Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 111 days.

(21) Appl. No.: 14/423,694

(22) PCT Filed: Feb. 8, 2015

(86) PCT No.: PCT/CN2015/072473
§ 371 (c)(1),
(2) Date: Feb. 24, 2015

(87) PCT Pub. No.: WO2016/082338
PCT Pub. Date: Jun. 2, 2016

(65) Prior Publication Data
US 2016/0343962 A1    Nov. 24, 2016

(30) Foreign Application Priority Data
Nov. 24, 2014  (CN) .......................... 2014 1 0683124

(51) Int. Cl.
*H01L 51/00*   (2006.01)
*H01L 51/52*   (2006.01)
(Continued)

(52) U.S. Cl.
CPC ...... *H01L 51/0097* (2013.01); *H01L 51/0007* (2013.01); *H01L 51/0022* (2013.01);
(Continued)

(58) Field of Classification Search
CPC combination set(s) only.
See application file for complete search history.

(56) References Cited

U.S. PATENT DOCUMENTS

2007/0037302 A1*  2/2007  Gaudiana .......... H01L 31/02242
                                                            438/16
2010/0127247 A1*  5/2010  Yang ..................... B82Y 10/00
                                                            257/40
(Continued)

FOREIGN PATENT DOCUMENTS

CN    103236504 A    8/2013
TW    201230072 A1   7/2012

*Primary Examiner* — Mamadou Diallo
(74) *Attorney, Agent, or Firm* — Andrew C. Cheng (57) ABSTRACT

The present invention provides a conductive flexible substrate and a manufacture method thereof and an OLED display device and a manufacture method thereof. The conductive flexible substrate comprises a flexible substrate (1), mesh conductive lines (2) located on the flexible substrate (1) and embossing from a surface of one side of the flexible substrate (1), and a conductive layer (3) filling among the mesh conductive lines (2); a surface of one side of the flexible substrate (1) away from the mesh conductive lines (2) and the conductive layer (3) is flat. The conductive flexible substrate is capable of promoting the conductivity of the flexible substrate, and applying the conductive flexible substrate to an OLED display device can solve the issue of low conductivity of anodes in the OLED display device.

10 Claims, 6 Drawing Sheets

(51) Int. Cl.
   *H01L 51/50*   (2006.01)
   *H01L 51/56*   (2006.01)
(52) U.S. Cl.
   CPC ...... *H01L 51/0037* (2013.01); *H01L 51/0043* (2013.01); *H01L 51/5206* (2013.01); *H01L 51/5212* (2013.01); *H01L 51/5221* (2013.01); *H01L 51/0039* (2013.01); *H01L 51/5072* (2013.01); *H01L 51/56* (2013.01); *H01L 2251/5338* (2013.01)

(56)　　　　　　References Cited

U.S. PATENT DOCUMENTS

| | | | | |
|---|---|---|---|---|
| 2012/0103660 A1* | 5/2012 | Gupta | ............... | H01L 51/0021 |
| | | | | 174/126.2 |
| 2014/0167006 A1* | 6/2014 | Kim | ............... | H01L 27/3244 |
| | | | | 257/40 |
| 2015/0171363 A1* | 6/2015 | Guo | ............... | H01L 51/0097 |
| | | | | 257/40 |

* cited by examiner

CONDUCTIVE FLEXIBLE SUBSTRATE AND MANUFACTURE THEREOF, AND OLED DISPLAY DEVICE AND MANUFACTURE METHOD THEREOF

FIELD OF THE INVENTION

The present invention relates to a display technology field, and more particularly to a conductive flexible substrate and a manufacture thereof, and an OLED display device and a manufacture method thereof utilizing the conductive flexible substrate.

BACKGROUND OF THE INVENTION

At present, the practical applied display devices mainly comprise Cathode Ray Tube (CRT), Liquid Crystal Display (LCD), Vacuum fluorescent devices (VFD), Plasma Display Panel (PDP), Organic Light-Emitting Device (OLED), Field Emission Display (FED) and Light-Emitting Device (LED). The LCD, OLED, etc, have been gradually replaced the CRT displays.

Organic Light Emitting Diode (OLED) is a flat panel display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". It has been favored by respective big display makers and has become the main selection of the third generation display element.

Compared with the LCD display devices, the OLED display devices possess advantages of being thinner, lighter, wide viewing angle, active lighting, continuous adjustable light color, low cost, fast response, low power consumption, low driving voltage, wide usage temperature range, simple production process and high illuminating efficiency and possible flexible display, and the investment for the production equipments is far smaller than the LCD. The OLED has earned the great attention of the industry and the scientific community due to its incomparable advantages and beautiful application prospect than other displays.

An OLED display generally comprises a substrate, anodes located on the substrate, an organic emitting layer located on the anodes, an electron transport layer located on the organic emitting layer, and cathodes located on the electron transport layer.

With the development of the OLED technology, the flexible display made with the flexible advantage of the OLED has been gradually commercialized. The flexible elements can be used to manufacture products which are more artistic sensed. For the preset OLED display device constructed by the anodes, the organic emitting layer, the cathodes, etc, as manufacturing the flexible OLED display, the manufacture flexible anodes and cathodes are extremely important, and the peel off phenomenon from the substrate cannot occur during the usage, and with low work function metal is generally employed for the anodes, and therefore, the cathodes needs a high work function material for the match. At present, a common anode material is conductive polymer material. However, the conductivity of the polymer material remains a certain difference from metal and Indium Tin Oxides (ITO), which results in low conductivity of the anodes.

SUMMARY OF THE INVENTION

An objective of the present invention is to provide a conductive flexible substrate and a manufacture method thereof, capable of promoting the conductivity of the flexible substrate, and applying the conductive flexible substrate to an OLED display device can solve the issue of low conductivity of anodes in the OLED display device.

Another objective of the present invention is to provide an OLED display device and a manufacture method thereof, capable of promoting the conductivity of the anodes in the OLED display device.

For realizing the aforesaid objective, the present invention first provides a conductive flexible substrate, comprising a flexible substrate, mesh conductive lines located on the flexible substrate and embossing from a surface of one side of the flexible substrate, and a conductive layer filling among the mesh conductive lines; a surface of one side of the mesh conductive lines and the conductive layer away from the flexible substrate is flat.

Material of the flexible substrate is photosensitive polymer.

Material of the mesh conductive lines is metal material, and material of the conductive layer is nano conductive material.

Metal material is silver or copper; the nano conductive material is graphene or carbon nano-tube.

The present invention further provides a manufacture method of a conductive flexible substrate, comprising steps of:

step 1, providing a glass substrate, and cleaning the glass substrate, and coating liquid metal material with mesh printing to form mesh metal lines on the glass substrate, and drying or curing to be a film to form mesh conductive lines with conductivity;

step 2, coating nano conductive material among the mesh conductive lines, and curing to be a film to form a conductive layer with conductivity;

step 3, coating photosensitive polymer on a surface of the glass substrate away from the mesh conductive lines and the conductive layer, and curing to form a film to form a flexible substrate;

step 4, removing the glass substrate to obtain the conductive flexible substrate.

a surface of one side of the flexible substrate away from the mesh conductive lines and the conductive layer is flat.

In the step 1, the liquid metal material is conductive silver paste, or copper or silver nano lines; in the step 2, the nano conductive material solution is graphene conductive polymer solution or carbon nano-tube conductive polymer solution The present invention further provides an OLED display device utilizing the aforesaid conductive flexible substrate, comprising a conductive flexible substrate, anodes located on the conductive flexible substrate, an emitting layer located on the anodes, an electron transport layer located on the emitting layer and cathodes on the electron transport layer;

The conductive flexible substrate comprises a flexible substrate, mesh conductive lines located on the flexible substrate and embossing from a surface of one side of the flexible substrate, and a conductive layer filling among the mesh conductive lines; a surface of one side of the flexible substrate away from the mesh conductive lines and the conductive layer is flat.

Material of the flexible substrate is photosensitive polymer; material of the mesh conductive lines is metal material; material of the conductive layer is nano conductive material; material of the cathodes is one or a mixture of two of poly ethylenedioxythiophene and poly(3,4-ethylendioxythiophene)-poly (styrenesulfonate); material of the electron transport layer is ethanol-soluble polyfluorene group polymer.

Metal material is silver or copper; the nano conductive material is graphene or carbon nano-tube.

The present invention further provides a manufacture method of an OLED display device, comprising steps of:

step 1, providing a conductive flexible substrate;

the conductive flexible substrate comprises a flexible substrate, mesh conductive lines located on the flexible substrate and embossing from a surface of one side of the flexible substrate, and a conductive layer filling among the mesh conductive lines; a surface of one side of the flexible substrate away from the mesh conductive lines and the conductive layer is flat.

step 2, coating conductive polymer on a surface of one side of the flexible substrate away from the mesh conductive lines and the conductive layer, and drying in a nitrogen environment with 120° C. to form anodes;

step 3, coating polymer luminescent material solvent or polymer and micromolecule luminescent material solvent, and drying in a waterless nitrogen environment with 120° C. to form an emitting layer;

step 4, coating electronic transmission polymer solution rhombic with the emitting layer solution on the emitting layer, and drying in a nitrogen environment with 120° C. to form an electron transport layer;

step 5, coating conductive silver paste on the electron transport layer to form cathodes.

The benefits of the present invention are: the present invention provides a conductive flexible substrate and a manufacture method thereof, by locating mesh conductive lines on the flexible substrate, and filling the conductive layer manufactured by the nano conductive material among the mesh conductive lines to promote the conductivity of the flexible substrate without influencing the transmission ratio of the flexible substrate. The present invention provides an OLED display device and a manufacture method thereof, utilizing the conductive flexible substrate located with the mesh conductive lines, and the conductive layer filling among the mesh conductive lines, capable of promoting the conductivity of the anodes in the OLED display device to solve the issue of low conductivity of anodes in the OLED display device.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
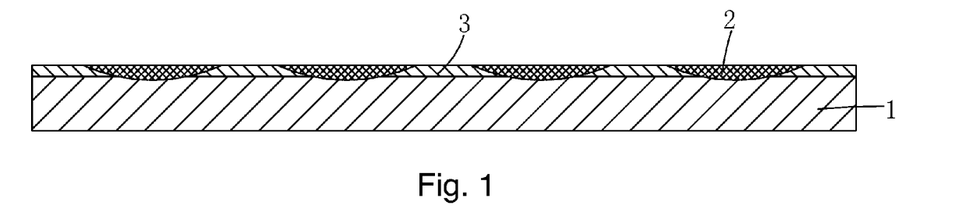
FIG. 1 is a sectional diagram of a conductive flexible substrate according to the present invention.
Figure 2:
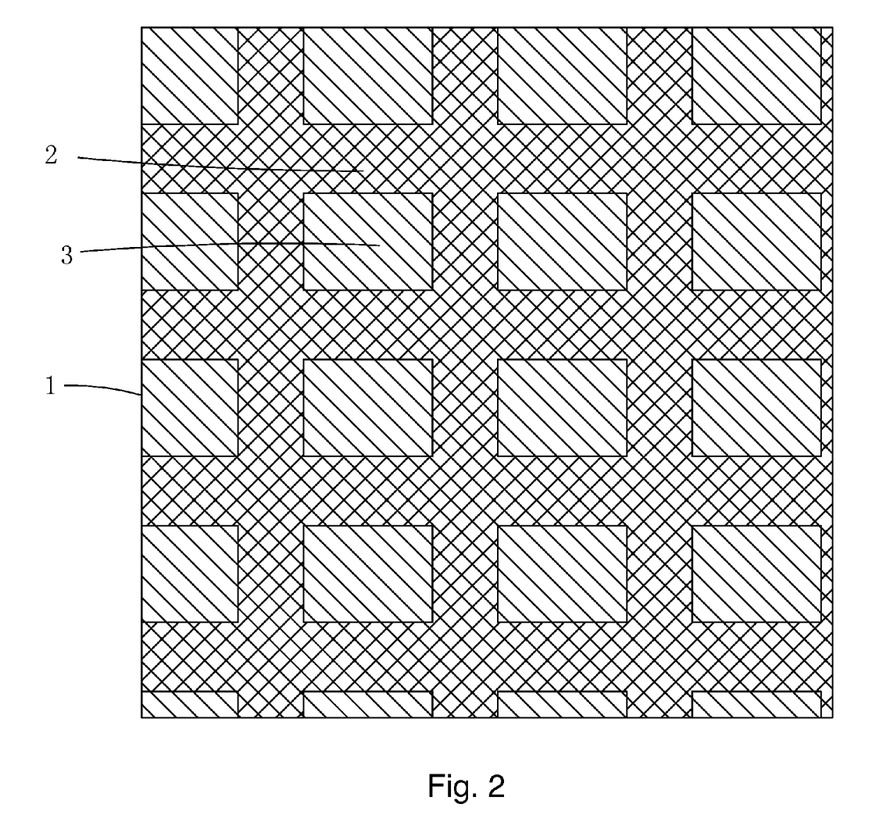
FIG. 2 is a top view diagram of the conductive flexible substrate according to the present invention.

Please refer to FIG. 1, FIG. 2 together, the present invention first provides a conductive flexible substrate, comprising a flexible substrate 1, mesh conductive lines 2 located on the flexible substrate 1 and embossing from a surface of one side of the flexible substrate 1, and a conductive layer 3 filling among the mesh conductive lines 2; a surface of one side of the mesh conductive lines 2 and the conductive layer 3 away from the flexible substrate 1 is flat.

Specifically, the flexible substrate 1 is manufactured by photosensitive polymer.

Material of the metal mesh lines 2 is metal material, such as silver, or copper, etc having good conductivity. Furthermore, the metal mesh lines 2 are manufactured by the liquid metal material, and the liquid metal material can be selected from conductive silver paste, or copper, silver nano lines, etc. The metal mesh lines 2 can be, but not restricted to be mesh arrangements of rectangular holes, circle holes, or regular polygon holes, and preferably, the metal mesh lines 2 are mesh arrangements of rectangular holes.

Material of the conductive layer 3 is nano conductive material, such as graphene or carbon nano-tube, etc. Furthermore, the conductive layer 3 is formed by curing the nano conductive material solution, and the nano conductive material solution can be selected from graphene conductive polymer solution or carbon nano-tube conductive polymer solution, etc.

Because the conductivity of the metal is good, as the metal mesh lines 2 are being the conductive frame of the entire conductive flexible substrate, the mesh structure promotes the conductivity of the flexible substrate 1, and meanwhile reduces the IR drop effect of the conductive layer 3, and promotes the conductivity of the flexible substrate 1 in advance.

Because the material of the conductive layer 3 is nano conductive material, and the nano conductive material is very thin, hard to be peeled off from the flexible substrate 1, and does not the influence the transmission ratio of the flexible substrate to well reserve the transparency of the flexible substrate 1, which can expand the application field.

The surface of one side of the mesh conductive lines 2 and the conductive layer 3 away from the flexible substrate 1 is flat to ensure the flatness of the surface of the conductive flexible substrate.

Figure 3:
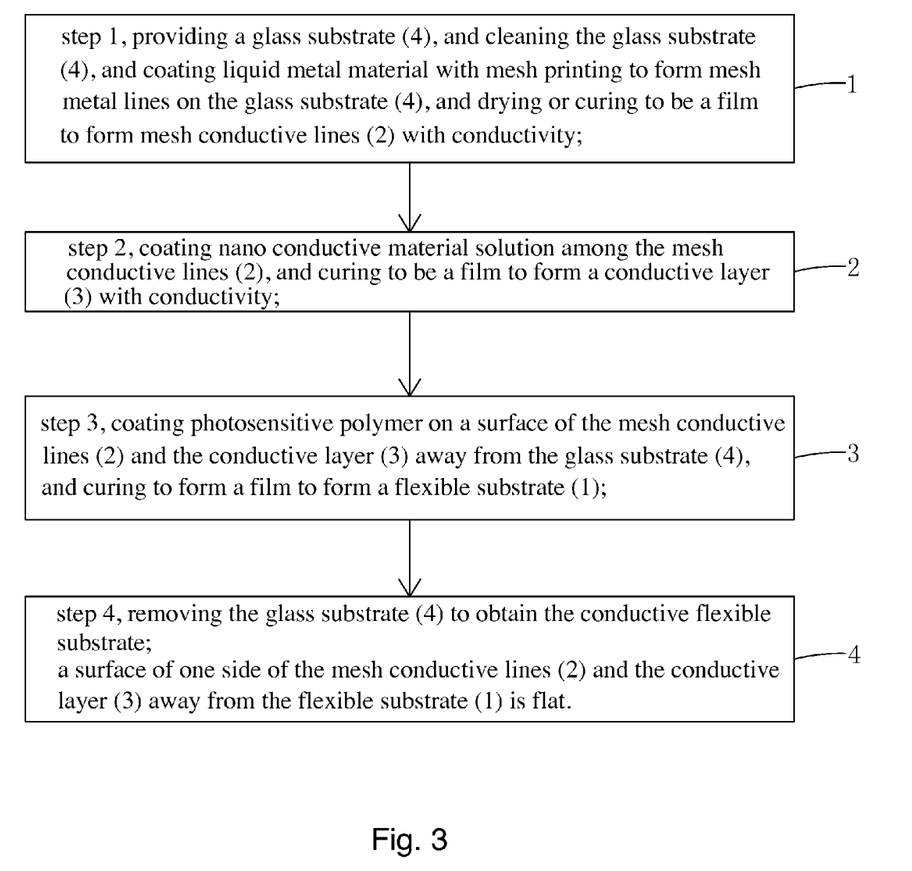
FIG. 3 is a flowchart of a manufacture method of the conductive flexible substrate according to the present invention.
Figure 4:
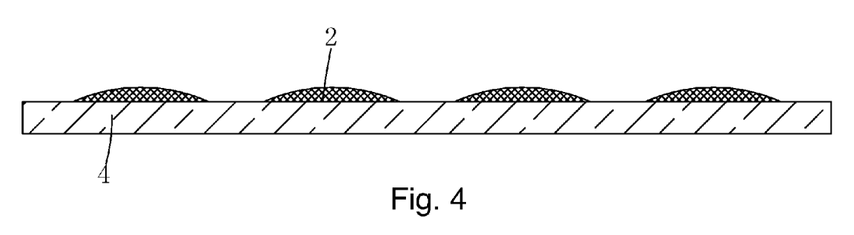
FIG. 4 is a sectional diagram of step 1 of the manufacture method of the conductive flexible substrate according to the present invention.
Figure 5:
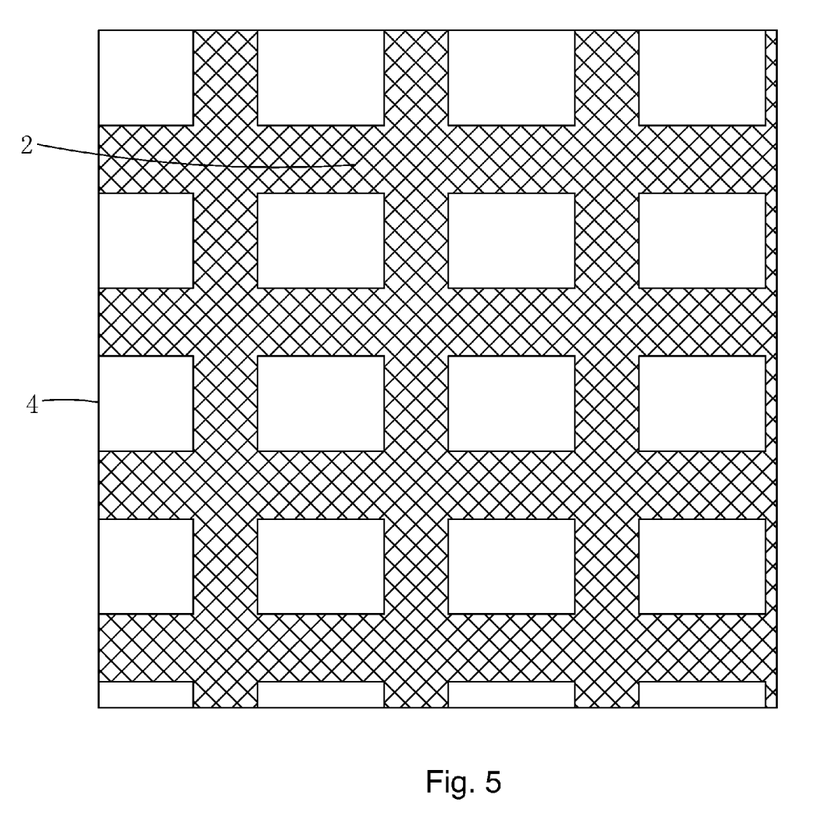
FIG. 5 is a top view diagram of the step 1 according to a manufacture method of a conductive flexible substrate according to the present invention.
Figure 6:
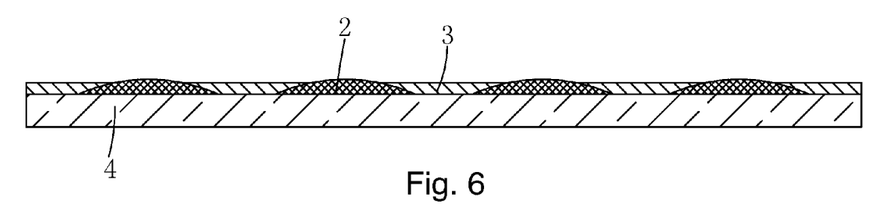
FIG. 6 is a sectional diagram of step 2 of the manufacture method of the conductive flexible substrate according to the present invention.
Figure 7:
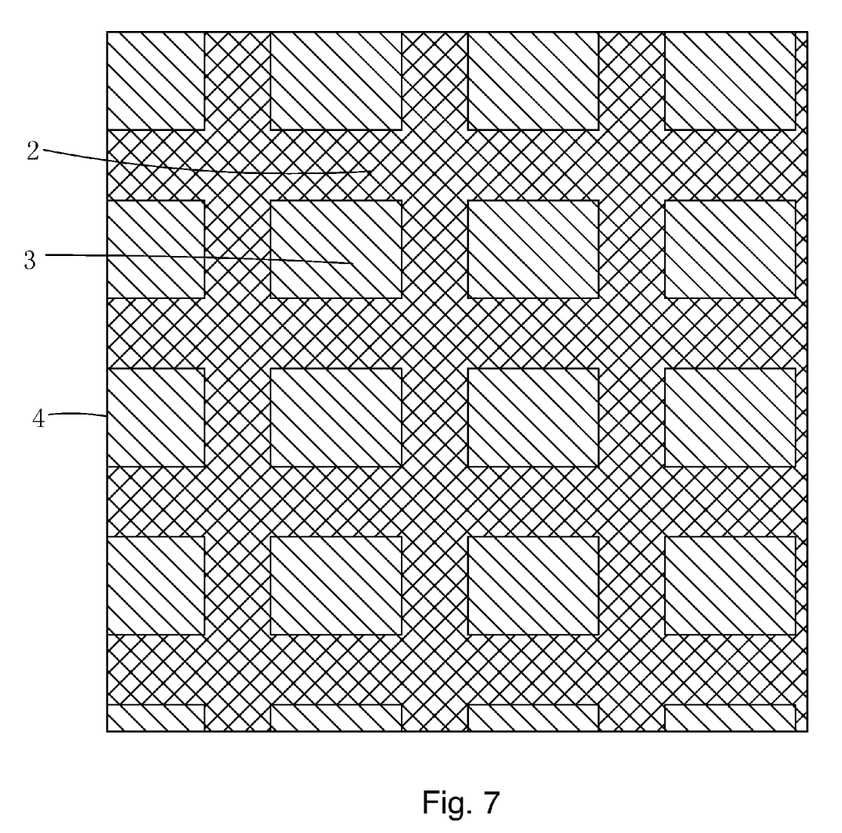
FIG. 7 is a top view diagram of the step 2 according to a manufacture method of a conductive flexible substrate according to the present invention.

Please refer to FIG. 3, the present invention further provides a manufacture method of a conductive flexible substrate, comprising steps of:

step 1, as shown in FIG. 4, FIG. 5, providing a glass substrate 4, and cleaning the glass substrate 4, and coating liquid metal material with mesh printing to form mesh metal lines on the glass substrate 4, and drying or curing to be a film to form mesh conductive lines 2 with conductivity;

In the step 1, the liquid metal material is selected from conductive silver paste, or copper, silver nano lines, etc., and accordingly to form the metal mesh lines 2 of metal material such as, silver, or copper, etc having good conductivity. The metal mesh lines 2 can be, but not restricted to be mesh arrangements of rectangular holes, circle holes, or regular polygon holes, and preferably, the metal mesh lines 2 are mesh arrangements of rectangular holes.

step 2, as shown in FIG. 6, FIG. 7, coating nano conductive material solution among the mesh conductive lines 2, and curing to be a film to form a conductive layer 3 with conductivity.

Figure 8:
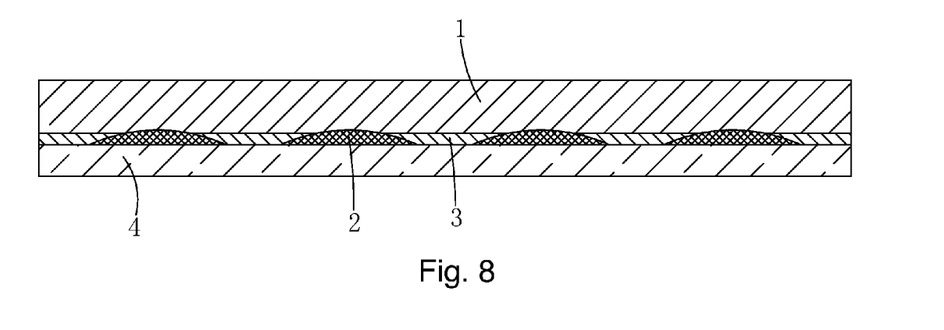
FIG. 8 is a sectional diagram of step 3 of the manufacture method of the conductive flexible substrate according to the present invention.

In the step 2, the nano conductive material solution can be selected from graphene conductive polymer solution or carbon nano-tube conductive polymer solution, etc. and accordingly to form a conductive layer 3 of graphene or carbon nano-tube, etc.

step 3, as shown in FIG. 8, coating photosensitive polymer on a surface of the mesh conductive lines 2 and the conductive layer 3 away from the glass substrate 4, and curing to form a film to form a flexible substrate 1.

Figure 9:
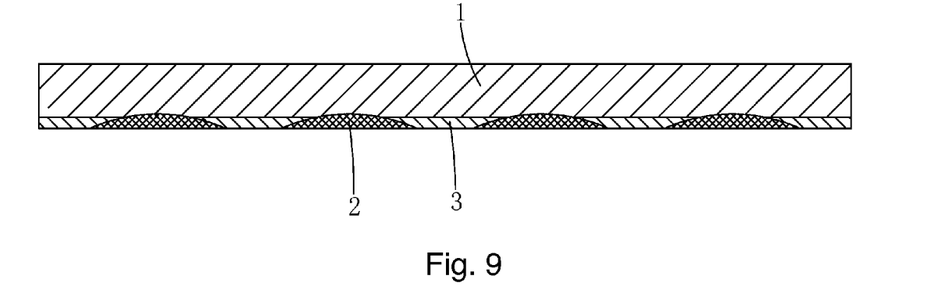
FIG. 9 is a sectional diagram of step 4 of the manufacture method of the conductive flexible substrate according to the present invention.

Specifically, the photosensitive polymer can be material of Styrene, acrylic, acrylate, epoxy resin, unsaturated polyester resin, amides or Vinyl acetate, etc.; each of the aforesaid material comprises monomer, prepolymer and photoinitiator; the aggregate type of the aforesaid material free radical, anionic or cationic.

step 4, as shown in FIG. 9, removing the glass substrate 4 to obtain the conductive flexible substrate.

A surface of one side of the mesh conductive lines 2 and the conductive layer 3 away from the flexible substrate 1 is flat.

In the aforesaid manufacture method of the conductive flexible substrate, because the conductivity of the metal is good, as the metal mesh lines 2 are being the conductive frame of the entire conductive flexible substrate, the mesh structure promotes the conductivity of the flexible substrate 1, and meanwhile reduces the IR drop effect of the conductive layer 3, and promotes the conductivity of the flexible substrate 1 in advance. Because the material of the conductive layer 3 is nano conductive material, and the nano conductive material is very thin, hard to be peeled off from the flexible substrate 1, and does not the influence the transmission ratio of the flexible substrate to well reserve the transparency of the flexible substrate 1, which can expand the application field. The surface of one side of the mesh conductive lines 2 and the conductive layer 3 away from the flexible substrate 1 is flat to ensure the flatness of the surface of the conductive flexible substrate.

Figure 10:
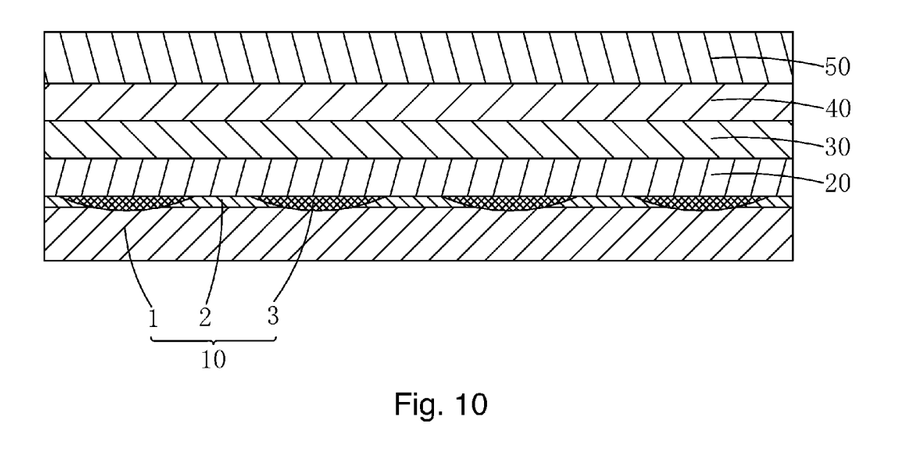
FIG. 10 is a sectional diagram of an OLED display device according to the present invention.

Please refer to FIG. 10, the present invention further provides an OLED display device applied with the aforesaid conductive flexible substrate 1, comprising a conductive flexible substrate 10, anodes 20 located on the conductive flexible substrate, an emitting layer 30 located on the anodes 20, an electron transport layer 40 located on the emitting layer and cathodes on the electron transport layer and cathodes 50 located on the electron transport layer 40.

Furthermore, the conductive flexible substrate 10 comprises a flexible substrate 1, mesh conductive lines 2 located on the flexible substrate 1 and embossing from a surface of one side of the flexible substrate 1, and a conductive layer 3 filling among the mesh conductive lines 2; a surface of one side of the mesh conductive lines 2 and the conductive layer 3 away from the flexible substrate 1 is flat.

Material of the flexible substrate 1 is photosensitive polymer. Material of the metal mesh lines 2 is metal material such as, silver, or copper, etc having good conductivity. Material of the conductive layer 3 is conductive material of graphene or carbon nano-tube, etc. Material of the cathodes 20 is one or a mixture of two of poly ethylenedioxythiophene and poly(3,4-ethylendioxythiophene)-poly (styrenesulfonate); material of the electron transport layer is ethanol-soluble polyfluorene group polymer. Material of the electron transport layer 40 can be ethanol-soluble polyfluorene group polymer, and PFN can be illustrated.

The aforesaid OLED display device utilizes the conductive flexible substrate 10 located with the mesh conductive lines 2, and the conductive layer 3 filling among the mesh conductive lines 2, and is capable of promoting the conductivity of the anodes 20 in the OLED display device to solve the issue of low conductivity of anodes in the OLED display device.

Figure 11:
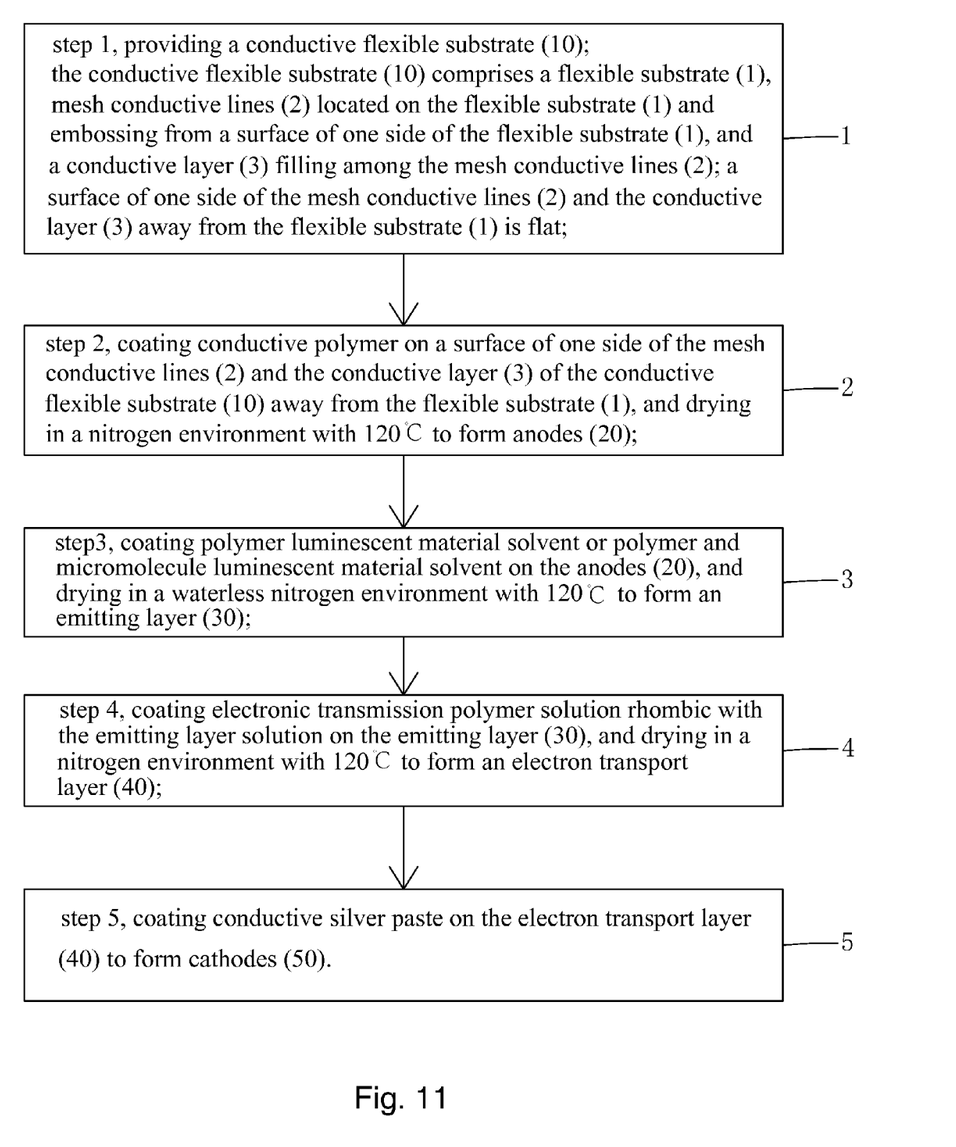
FIG. 11 is a flowchart of a manufacture method of the OLED display device according to the present invention.

Finally, referring to FIG. 11 with FIG. 10, the present invention further provides a manufacture method of an OLED display device, comprising steps of:

step 1, providing a conductive flexible substrate 10;

The conductive flexible substrate 10 comprises a flexible substrate 1, mesh conductive lines 2 located on the flexible substrate 1 and embossing from a surface of one side of the flexible substrate 1, and a conductive layer 3 filling among the mesh conductive lines 2; a surface of one side of the mesh conductive lines 2 and the conductive layer 3 away from the flexible substrate 1 is flat.

Material of the flexible substrate 1 is photosensitive polymer. Material of the metal mesh lines 2 is metal material such as, silver, or copper, etc having good conductivity. Material of the conductive layer 3 is conductive material of graphene or carbon nano-tube, etc.

step 2, coating conductive polymer on a surface of one side of the mesh conductive lines 2 and the conductive layer 3 of the conductive flexible substrate 10 away from the flexible substrate 1, and drying in a nitrogen environment with 120° C. to form anodes 20.

Material of the conductive polymer is one or a mixture of two of poly ethylenedioxythiophene and poly(3,4-ethylendioxythiophene)-poly (styrenesulfonate); material of the electron transport layer is ethanol-soluble polyfluorene group polymer.

step 3, coating polymer luminescent material solvent or polymer and micromolecule luminescent material solvent on the anodes 20, and drying in a waterless nitrogen environment with 120° C. to form an emitting layer 30.

step 4, coating electronic transmission polymer solution rhombic with the emitting layer solution on the emitting layer 30, such as ethanol-soluble polyfluorene group polymer, and PFN can be illustrated and drying in a nitrogen environment with 120° C. to form an electron transport layer 40;

step 5, coating conductive silver paste on the electron transport layer 40 to form cathodes 50.

Thus, the manufacture of the OLED display device is accomplished. The aforesaid manufacture method of the OLED display device utilizes the conductive flexible substrate 10 located with the mesh conductive lines 2, and the conductive layer 3 filling among the mesh conductive lines 2, and is capable of promoting the conductivity of the anodes 20 in the OLED display device to solve the issue of low conductivity of anodes 20 in the OLED display device.

In conclusion, the conductive flexible substrate and the manufacture method of the present invention, by locating mesh conductive lines on the flexible substrate, and filling the conductive layer manufactured by the nano conductive material among the mesh conductive lines, can promote the conductivity of the flexible substrate without influencing the transmission ratio of the flexible substrate. The OLED display device and the manufacture method thereof of the present invention utilize the conductive flexible substrate located with the mesh conductive lines, and the conductive layer filling among the mesh conductive lines, capable of promoting the conductivity of the anodes in the OLED display device to solve the issue of low conductivity of anodes in the OLED display device.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A conductive flexible substrate, comprising a flexible substrate, mesh conductive lines directly located on and in contact with the flexible substrate and embossing from a surface of the flexible substrate, and a conductive layer filling among the mesh conductive lines and in direct contact with the surface of the substrate; wherein a surface of the mesh conductive lines that is distant from the flexible substrate and a surface of the conductive layer that is distant from the flexible substrate are both substantially flat and flush with each other so as to collectively define a common flat surface that is distant from the flexible substrate.

2. The conductive flexible substrate according to claim 1, wherein material of the flexible substrate is photosensitive polymer.

3. The conductive flexible substrate according to claim 1, wherein material of the mesh conductive lines is metal material, and material of the conductive layer is conductive nano material.

4. The conductive flexible substrate according to claim 3, wherein the metal material is silver or copper; the conductive nano material is graphene or carbon nano-tube.

5. A manufacture method of a conductive flexible substrate, comprising steps of:
   step 1, providing a glass substrate, and cleaning the glass substrate, and coating liquid metal material with mesh printing to form mesh metal lines on the glass substrate, and drying or curing to be a film to form mesh conductive lines with conductivity;
   step 2, coating conductive nano material among the mesh conductive lines, and curing to be a film to form a conductive layer with conductivity;
   step 3, coating photosensitive polymer on one side of the mesh conductive lines and the conductive layer that is distant from the glass substrate, and curing to form a film to form a flexible substrate that is in direct contact with the mesh conductive lines and the conductive layer; and
   step 4, removing the glass substrate to obtain the conductive flexible substrate,
   wherein a surface of the mesh conductive lines that is distant from the flexible substrate and a surface of the conductive layer that is distant from the flexible substrate are both substantially flat and flush with each other so as to collectively define a common flat surface that is distant from the flexible substrate.

6. The manufacture method of a conductive flexible substrate according to claim 5, wherein in step 1, the liquid metal material is conductive silver paste, or copper or silver nano lines; and in step 2, the conductive nano material solution is graphene conductive polymer solution or carbon nano-tube conductive polymer solution.

7. An OLED display device, comprising: a conductive flexible substrate, anodes located on the conductive flexible substrate, an emitting layer located on the anodes, an electron transport layer located on the emitting layer and cathodes on the electron transport layer;
   the conductive flexible substrate comprising a flexible substrate, mesh conductive lines directly located on and in contact with the flexible substrate and embossing from a surface of the flexible substrate, and a conductive layer filling among the mesh conductive lines and in direct contact with the surface of the substrate; wherein a surface of the mesh conductive lines that is distant from the flexible substrate and a surface of the conductive layer that is distant from the flexible substrate are both substantially flat and flush with each other so as to define a commonly flat surface that is distant from the flexible substrate.

8. The OLED display device according to claim 7, wherein material of the flexible substrate is photosensitive polymer; material of the mesh conductive lines is metal material; material of the conductive layer is conductive nano material; material of the anodes is one or a mixture of two of poly ethylenedioxythiophene and poly(3,4-ethylendioxythiophene)-poly (styrenesulfonate); material of the electron transport layer is ethanol-soluble polyfluorene group polymer.

9. The OLED display device according to claim 8, wherein the metal material is silver or copper; and the conductive nano material is graphene or carbon nano-tube.

10. A manufacture method of an OLED display device, comprising steps of:
    step 1, providing a conductive flexible substrate;
    wherein the conductive flexible substrate comprises a flexible substrate, mesh conductive lines directly located on and in contact with the flexible substrate and embossing from a surface of the flexible substrate, and a conductive layer filling among the mesh conductive lines and in direct contact with the surface of the substrate; wherein a surface of the mesh conductive lines that is distant from the flexible substrate and a surface of the conductive layer that is distant from the flexible substrate are both substantially flat and flush with each other so as to collectively define a common flat surface that is distant from the flexible substrate;
    step 2, coating conductive polymer on the common flat surface of the mesh conductive lines and the conductive layer that is distant from the flexible substrate, and drying in a nitrogen environment with 120° C. to form anodes;

step 3, coating polymer luminescent material solvent or polymer and micromolecule luminescent material solvent on the anodes, and drying in a waterless nitrogen environment with 120° C. to form an emitting layer;

step 4, coating electronic transmission polymer solution rhombic with the emitting layer solution on the emitting layer, and drying in a nitrogen environment with 120° C. to form an electron transport layer; and step 5, coating conductive silver paste on the electron transport layer to form cathodes.

* * * * *